(12) United States Patent
Powell (10) Patent No.: US 7,071,117 B2
(45) Date of Patent: Jul. 4, 2006

(54) SEMICONDUCTOR DEVICES AND METHODS FOR DEPOSITING A DIELECTRIC FILM

(75) Inventor: Don C. Powell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/788,892

(22) Filed: Feb. 27, 2004

(65) Prior Publication Data

US 2005/0191866 A1 Sep. 1, 2005

(51) Int. Cl.
*H01L 21/31* (2006.01)
*H01L 21/469* (2006.01)
*H01L 21/8242* (2006.01)

(52) U.S. Cl. ............... 438/758; 438/244; 438/778

(58) Field of Classification Search .......... 438/758, 438/760, 216, 257, 240, 244, 248, 387, 391, 438/393, 778

See application file for complete search history.

(56) References Cited

U.S. PATENT DOCUMENTS

| | | | |
|---|---|---|---|
| 4,438,157 A | 3/1984 | Romano-Moran | 427/93 |
| 4,529,621 A * | 7/1985 | Ballard | 438/3 |
| 4,810,673 A | 3/1989 | Freeman | 437/239 |
| 4,981,724 A * | 1/1991 | Hochberg et al. | 427/255.37 |
| 5,001,527 A | 3/1991 | Hosaka | 357/23.5 |
| 5,330,936 A | 7/1994 | Ishitani | 437/241 |
| 6,083,355 A * | 7/2000 | Spence | 204/164 |
| 6,106,659 A * | 8/2000 | Spence et al. | 156/345.43 |
| 6,265,297 B1 | 7/2001 | Powell | 438/592 |
| 6,348,380 B1 | 2/2002 | Weimer et al. | 438/257 |
| 6,350,707 B1 | 2/2002 | Liu et al. | 438/791 |
| 6,410,968 B1 | 6/2002 | Powell et al. | 257/412 |
| 6,423,617 B1 | 7/2002 | Powell | 438/476 |
| 6,458,714 B1 | 10/2002 | Powell et al. | 438/770 |
| 6,471,780 B1 | 10/2002 | Mercaldi et al. | 118/725 |
| 6,475,883 B1 | 11/2002 | Powell et al. | 438/486 |
| 6,537,677 B1 | 3/2003 | Mercaldi et al. | 428/469 |
| 6,555,487 B1 | 4/2003 | Weimer et al. | 438/151 |
| 6,576,964 B1 | 6/2003 | Powell et al. | 257/405 |
| 6,576,979 B1 | 6/2003 | Weimer et al. | 257/629 |
| 6,617,624 B1 | 9/2003 | Powell | 257/288 |
| 6,620,742 B1 | 9/2003 | Powell | 438/786 |

(Continued)

OTHER PUBLICATIONS

Lesar, A, et al., "15N and 18O kinetic isotope effects in the thermal decomposition of N20 catalyzed by bromine", *J. Chem. Phys. 99 (1)*, (Jul. 1, 1993), 187-95.

(Continued)

*Primary Examiner*—Walter L. Lindsay, Jr.
(74) *Attorney, Agent, or Firm*—Schwegman, Lundberg, Woessner & Kluth, P.A.

(57) ABSTRACT

Embodiments provide methods and apparatuses for chemical vapor depositing a dielectric film, and various structures, devices, and systems, which incorporate dielectric elements formed from the dielectric film. The method includes heating a chamber, within which a substrate is located, to a temperature sufficient to thermally decompose an oxidizing component. A gas flow is passed over the substrate to deposit the dielectric film. To form an oxide, the gas flow includes a silicon bearing component, the oxidizing component, and a chloride component. The silicon bearing component and the chloride component are distinct from each other. To form an oxynitride, the gas flow further includes an ammonia component. The silicon bearing component can be substituted by a tantalum bearing component or an aluminum bearing component, to form other types of oxynitrides.

39 Claims, 5 Drawing Sheets

U.S. PATENT DOCUMENTS

| | | | |
|---|---|---|---|
| 6,649,278 B1 | 11/2003 | Mercaldi et al. | 428/620 |
| 6,670,231 B1 | 12/2003 | Powell et al. | 438/216 |
| 6,734,531 B1 | 5/2004 | Weimer et al. | 257/629 |
| 6,767,795 B1 | 7/2004 | Ahn | 438/287 |
| 6,838,125 B1 * | 1/2005 | Chung et al. | 427/562 |
| 2001/0025971 A1 | 10/2001 | Powell | 257/288 |
| 2002/0025658 A1 | 2/2002 | Powell et al. | 438/486 |
| 2002/0060348 A1 | 5/2002 | Powell et al. | 257/412 |
| 2002/0066534 A1 | 6/2002 | Mercaldi et al. | 156/345.27 |
| 2002/0068178 A1 | 6/2002 | Mercaldi et al. | 428/446 |
| 2002/0096745 A1 | 7/2002 | Weimer et al. | 257/629 |
| 2002/0102860 A1 | 8/2002 | Mercaldi et al. | 438/758 |
| 2002/0117709 A1 | 8/2002 | Weimer et al. | 257/315 |
| 2002/0135031 A1 | 9/2002 | Powell et al. | 257/405 |
| 2002/0173122 A1 | 11/2002 | Powell | 438/476 |
| 2003/0071316 A1 | 4/2003 | Gonzalez et al. | 257/407 |
| 2003/0153144 A1 | 8/2003 | Weimer et al. | 438/200 |
| 2003/0160305 A1 | 8/2003 | Weimer et al. | 257/629 |
| 2003/0201068 A1 | 10/2003 | Mercaldi et al. | 156/345.27 |
| 2004/0106248 A1 | 6/2004 | Powell et al. | 438/200 |

OTHER PUBLICATIONS

Zhang, A, et al., "Charaterization of the optical loss of an integrated silicon oxynitride optical switch structure", *Applied Physics Letters, 83 (13)*, (Sep. 29, 2003),2524-26.

* cited by examiner

SEMICONDUCTOR DEVICES AND METHODS FOR DEPOSITING A DIELECTRIC FILM

TECHNICAL FIELD

The present invention relates generally to methods and apparatus for substrate processing, and more particularly to methods and apparatus for improved deposition of dielectric films on a semiconductor substrate.

BACKGROUND

One process that is performed during the fabrication of a semiconductor device is to form a dielectric film, such as silicon oxide ($SiO_2$) or silicon nitride ($SiN_2$), on a semiconductor substrate. A thermal chemical vapor deposition (CVD) process is sometimes used to deposit such films. In this process, reactive gases are supplied to a substrate surface, and heat-induced chemical reactions take place to produce the desired film.

Various combinations of reactive gasses have been used to produce silicon oxide and silicon nitride dielectric films. These combinations generally include a silicon source and an oxidizing or nitridizing species. For example, dichlorosilane ($SiH_2Cl_2$), also referred to as DCS, has been used as a silicon source, and nitrous oxide ($N_2O$) has been used as an oxidizing species. Ammonia ($NH_3$) has been used as a nitrogen source.

In a multi-wafer CVD system, multiple semiconductor wafers are loaded into a reaction tube, the tube is heated, and the reactive gasses are introduced at an entry point at a one end of the tube. The gasses pass over the wafers and through the tube to an exit point. During the reaction, the DCS may be subjected to dissociation of hydrogen to produce dichlorosilane ($SiCl_2$) and hydrogen ($H_2$) as shown in the following equation (1).

$$SiH_2Cl_2 \rightarrow SiCl_2 + H_2 \qquad (1)$$

At a high temperature, the chemical bond between the silicon atom and both the two chlorine atoms and the hydrogen atom are subjected to the elimination of hydrogen and chlorine to make the silicon atom into a new silicon atom terminated by the sole chlorine atom. Meanwhile, thermal decomposition of the $N_2O$ occurs all along the tube, and the thermal decomposition of the $N_2O$ is catalyzed by the chlorine by-product.

At the entry end of the reaction tube, the amount of chlorine gas available from the DCS decomposition is relatively small. Therefore, the decomposition rate of the $N_2O$ is simply characteristic of a thermally-driven decomposition. However, further along the tube, a higher concentration of chlorine exists as a by-product of the DCS decomposition. The higher abundance of chlorine increasingly interacts with and enhances the decomposition and reaction of the $N_2O$, which increases the oxidation reaction rate. Accordingly, at the entry end of the tube, a more nitrogen rich environment exists, and toward the exit end of the tube, a more chlorine rich environment exists. This causes a non-stable reaction stoichiometry and rate from one end of the tube to the other. The result is that oxide films deposited near the entry end of the tube are thinner than oxide films deposited further down the tube.

What are needed are methods and apparatus for depositing dielectric layers in a more stable manner. Further needed are methods and apparatus for stabilizing the reaction stoichiometry and the reaction rate in various CVD systems, including CVD systems that utilize reaction tubes.

SUMMARY

In one embodiment, a method includes heating a chamber, within which a substrate is located, to a temperature sufficient to thermally decompose an oxidizing component. A gas flow is passed over the substrate to deposit a dielectric film. The gas flow includes a silicon bearing component, the oxidizing component, and a chloride component, which is distinct from the silicon bearing component. In another embodiment, the gas flow includes a silicon bearing component, an oxidizing component, an ammonia component, and a chloride component, which is distinct from the silicon bearing component.

In still another embodiment, a method includes heating a silicon substrate, in a furnace deposition tube, to a temperature in a range of 700 degrees C. to 950 degrees C., inclusive. The silicon substrate is thermally oxidized, in the furnace tube, using gaseous reactants. The gaseous reactants include a chloride component, dichlorosilane, and nitrous oxide.

In still other embodiments, a semiconductor device, a memory array, a memory device, a semiconductor die, or an electronic system include a substrate and a dielectric element. The dielectric element includes at least a portion of a chemical vapor deposited dielectric layer formed from passing a gas flow over the substrate to deposit the dielectric layer. The gas flow includes a silicon bearing component, an oxidizing component, and a chloride component. The silicon bearing component and the chloride component are distinct from each other.

DESCRIPTION OF THE EMBODIMENTS

In the following description of the embodiments, reference is made to the accompanying drawings, which form a part hereof and show, by way of illustration, specific embodiments in which the invention may be practiced. These embodiments are described in sufficient detail to enable those skilled in the art to practice the invention, and it is to be understood that other embodiments may be utilized, and that process or mechanical changes may be made, without departing from the scope of the present invention. It will be recognized that the methods of the various embodiments can be combined in practice, either concurrently or in succession. Various permutations and combinations will be readily apparent to those skilled in the art.

The various embodiments of the invention, described in detail herein, involve new and novel methods and apparatus for depositing dielectric layers. The embodiments of the present invention have several significant advantages over prior art methods. First, use of the embodiments of the invention result in deposition of dielectric layers in a more stable manner than is achieved using prior art methods. Further, use of the embodiments of the invention result in stabilization of the reaction stoichiometry and the reaction rate in various CVD systems.

Figure 1:
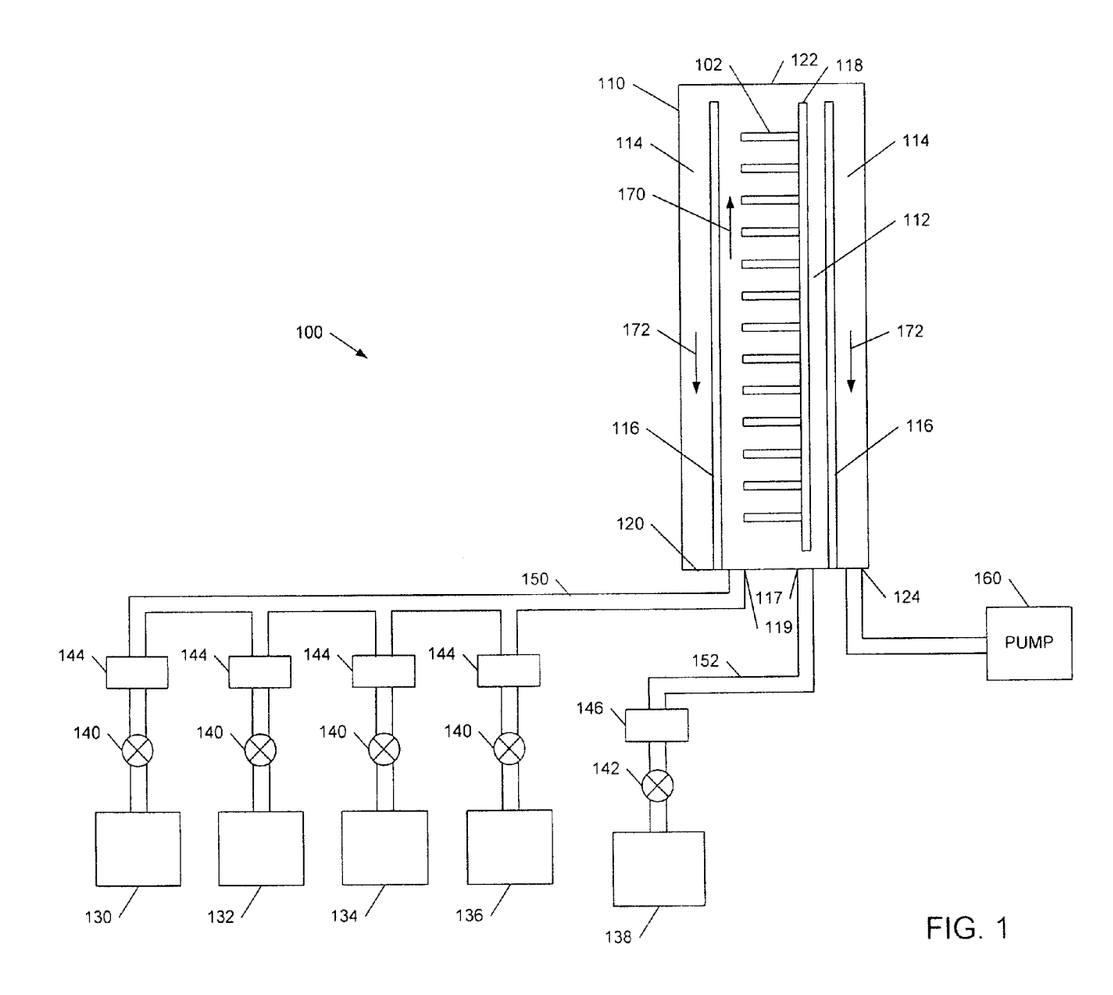
FIG. 1 illustrates a schematic representation of a deposition system suitable for depositing a dielectric film, in accordance with an embodiment of the invention.

FIG. 1 illustrates a schematic representation of a low pressure chemical vapor deposition (CVD) system 100 suitable for depositing a dielectric film, in accordance with an embodiment of the invention. In various embodiments, the system 100 is used to deposit an oxide film, a nitride film, and/or an oxynitride film on a substrate. In one embodiment, system 100 includes a reaction tube 110, gas sources 130, 132, 134, 136, 138, valves 140, 142, flow controllers 144, 146, manifolds 150, 152, and pump 160.

Reaction tube 110 is a multi-wafer furnace deposition tube, in one embodiment, oriented with its axis in a substantially vertical direction, and having an inner chamber 112 and an outer chamber 114. The inner chamber 112 is defined by an inner surface of an inner tube 116. The outer chamber 114 is defined by an outer surface of the inner tube 116 and the inner surface of the reaction tube 110. Tube 110 is in a range of about 150–250 centimeters long, in one embodiment, with an inner diameter of about 12–20 centimeters. Longer or shorter tubes having larger or smaller inner diameters can be used in other embodiments.

Prior to dielectric film deposition, one or more wafers 102 are loaded into a multi-wafer carrier 118, the carrier 118 is loaded into the inner chamber 112, and the reaction tube 110 is sealed, as illustrated in FIG. 1. In one embodiment, carrier 118 includes a sufficient number of slots to support from 100–200 wafers, although all of the slots need not be filled during any particular reaction. Wafers 102 are typically approximately 10 centimeters in diameter, although they can be larger or smaller as well. Wafers 102 are supported in carrier 118 with their major surfaces at right angles to the axis of the tube 110 and the direction of gas flow. This arrangement permits a close-packed loading which contributes to a potentially high wafer throughput of the system 100.

In one embodiment, inert and reactive gasses are admitted to the tube 110 at entry points 117, 119 at a first end 120 of the tube 110. The gasses travel through the inner chamber 112 and over the wafers 102 in a direction indicated generally by arrow 170. At a second end 122 of the tube 110, the gasses are displaced toward the outer chamber 114, through which they travel back toward the first end 120 of the tube in a direction indicated generally by arrows 172. The gasses are then exhausted from the tube 110 at an exit point 124, and recovered by a scavenging system (not illustrated).

In an alternate embodiment, the reaction tube can have only a single, inner chamber, where the reaction gasses are input through an entry point at the first end 120 of the tube, and the gasses are exhausted through an exit point at the second end 122 of the tube. In another alternate embodiment, the reaction tube can be a horizontally-oriented tube.

In still other embodiments, different types of single- or multi-wafer reaction chambers can be used for the CVD process. For example, but not by way of limitation, the system can include one or more conductive heating elements upon which the wafers are placed and heated prior to introduction of the reactive gasses, in one embodiment. In still another embodiment, limited reaction processing (i.e. transient heating rather than furnace heating) can be used. In still another alternate embodiment, a plasma based CVD system can be used, where the reaction temperatures may be cooler than the temperatures used in a thermal CVD system. A plasma enhanced CVD processes promotes the excitation and/or dissociation of reactant gases by the application of radio frequency (RF) energy to the reaction zone proximate a substrate surface. This creates a plasma of highly reactive species. The high reactivity of the released species reduces the energy required for a chemical reaction to take place, and thus lowers the required temperature for such CVD processes.

Referring again to the embodiment illustrated in FIG. 1, reaction tube 110 can include one or more thermal zones. In one embodiment, the tube 110 includes five thermal zones, although more or fewer zones can be included in other embodiments. Using heating coils (not illustrated) associated with each zone, the temperature within each particular zone along the tube can be independently controlled, permitting the attainment of a flat or graded temperature profile along the length of the tube 110. By varying the temperature within any zone, the reaction rate within that zone can be adjusted.

In one embodiment, the reaction gasses from sources 130, 132, 134, 136 are admitted to manifold 150 via valves 140, respectively, and their flow rates are controlled by mass flow controllers 144. Similarly, an inert gas from source 138 is admitted to manifold 152 via valve 142, and its flow rate is controlled by mass flow controller 146. The reaction gasses and inert gas are admitted to the tube 110 via manifolds 150, 152, respectively.

In one embodiment, while forming an oxide layer, the reaction gasses include a silicon bearing component 130, an oxidizing component 132, and a chloride component 134. While the silicon bearing component 130 can include chloride, in various embodiments, the silicon bearing component 130 and the chloride component 134 are distinct from one another, meaning that each component is a distinct reaction gas introduced into the chamber. In other words, while chloride may (or may not) be a byproduct of the decomposition of the silicon bearing component 130, the chloride component 134 augments and is distinct from any such byproduct. In another embodiment, while forming an oxynitride layer, the reaction gasses also include an ammonia component 136. The inert gas includes a nitrogen source 138, in one embodiment. Other inert gasses (e.g., argon, etc.) also can be included or alternatively used, in other embodiments.

Figure 2:
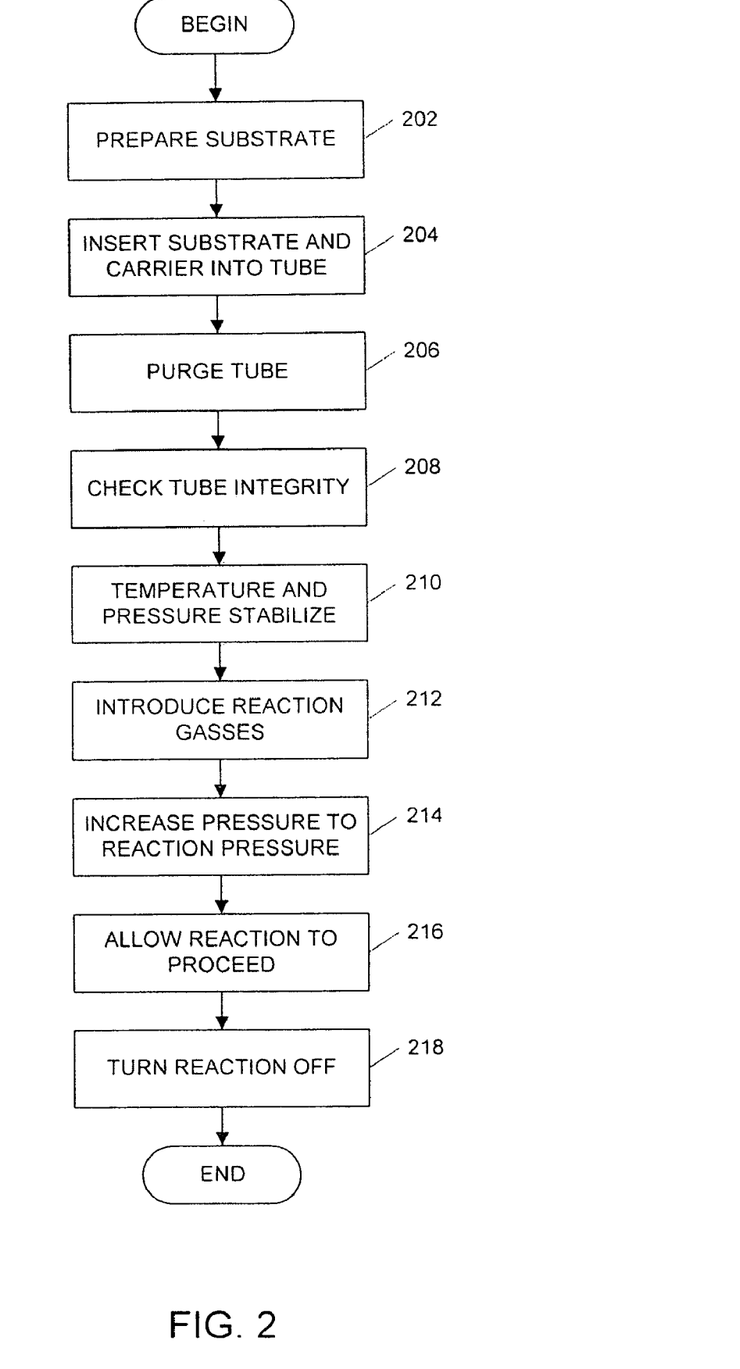
FIG. 2 illustrates a flowchart of a method for producing a dielectric film on a substrate, in accordance with an embodiment of the invention.

FIG. 2 illustrates a flowchart of a method for producing a dielectric film on a substrate, in accordance with an embodiment of the invention. The method begins, in block 202, by preparing a substrate for deposition. For example, the surface of the substrate can be etched or otherwise prepared. In one embodiment, the substrate is a silicon wafer, which may or may not have semiconductor structures formed thereon. In other embodiments, the substrate can be a semiconductor such as germanium, gallium arsenide or indium phosphide, an insulator such as glass or aluminum, or a metal such as stainless steel or iron.

In block 204, the substrate is then positioned within a carrier (e.g., carrier 118, FIG. 1), alone or along with one or more other substrates. The carrier is inserted into the reaction tube (e.g., tube 110, FIG. 1) or other type of reaction chamber, at atmospheric pressure. The tube is then sealed.

In one embodiment, the tube is then cycle purged, in block 206, to rid the tube of contaminants. This process may involve several iterations during which the inert gas source (e.g., source 138, FIG. 1, which could be nitrogen, and/or argon, and/or another inert gas, for example) is alternatively turned on and off, and the pressure within the tube is varied between low and relatively high values.

The tube integrity can then be checked, in block 208. In one embodiment, this involves turning the inert gas source off, reducing the tube pressure to a very low value (e.g., 50 millitorr), and performing a leak rate test to determine how fast the tube pressure rises.

Assuming the tube integrity is acceptable, the inert gas source is turned on, and the tube is temperature and pressure stabilized, in block 210, for a period of time (e.g., 2 hours). In one embodiment, the pressure is set to a pre-reaction value, and the temperature is set to a reaction value. In one embodiment, the pre-reaction pressure is approximately 150 millitorr. The reaction temperature is a temperature sufficient to thermally decompose the oxidizing component of the reaction gasses. In one embodiment, the reaction temperature is between 700 and 950 degrees C., inclusive. In other embodiments, higher or lower values can be used, and/or the tube can be stabilized for a longer or shorter period of time.

The limitations on the reaction temperature range are based on the ideas that, if the temperature is too low, growth will proceed so slowly that it is uneconomic, or will stop altogether, and if the temperature is too high, free-space nucleation may occur, which will lead to particulate formation and degradation of the film quality.

The reaction gas manifold (e.g., manifold 142, FIG. 1) is then opened, at the pre-reaction pressure, and the reaction gasses are introduced into the tube, in block 212. The gas flow passes over the substrates within the tube.

In one embodiment, the reaction gasses are introduced in the following order. First, oxidizing component (e.g., source 132, FIG. 1) is introduced, and its concentration is permitted to stabilize for several minutes. In one embodiment, the oxidizing component is gaseous nitrous oxide ($N_2O$). It is conceivable that other oxidizing species can be substituted for nitrous oxide, while still preserving some of the advantages of the invention. Second, the chloride component (e.g., source 134) is introduced and permitted to stabilize. In one embodiment, the chloride component is hydrogen chloride (HCl), and in another embodiment, the chloride component is chlorine ($Cl_2$).

If an oxynitride film is being formed, then an ammonia component (e.g., source 136) is then introduced, and permitted to stabilize. In one embodiment, the ammonia component is ammonia gas ($NH_3$). If an oxide film is being formed, an ammonia component is not introduced.

Finally, a precursor component (e.g., source 136) is introduced. In various embodiments, the precursor component can be selected from a group consisting of a silicon bearing component, a tantalum bearing component, and an aluminum bearing component, in any combination.

In one embodiment, the precursor component is a silicon bearing component. The silicon bearing component can consist essentially of one or more halated silanes. In one embodiment, the silicon bearing component is selected from the group consisting of silane, disilane, monochlorosilane, dichlorosilane, trichlorosilane, and tetrachlorosilane, in any combination. Use of a silicon bearing component will result in the deposition of a silicon dioxide film or silicon oxynitride film (i.e., when ammonia is present).

In other embodiments, chlorosilanes which contain other halogen species can be substituted, wholly or partially, for the silicon bearing components discussed above. Desirably, the gaseous silicon source is neither too stable nor too unstable. If the silicon source is too stable, excessively high growth temperatures may be required. Conversely, if the silicon source is too unstable, gas-phase nucleation may occur, leading to particulate formation. Fluorinated chlorosilanes (e.g., $SiH_3F$) or bromine substitutions (e.g., $SiHBrCl_2$) can be used in alternate embodiments.

In other embodiments, the precursor component is a tantalum bearing component or an aluminum bearing component. Use of such precursors will result in the deposition of a tantalum oxynitride film or an aluminum oxynitride film, respectively (i.e., when ammonia is present).

In block 214, the pressure is raised to the reaction pressure. In one embodiment, the reaction pressure is approximately 350 millitorr. In other embodiments, the reaction pressure is in a range of about 50 millitorr to 4000 millitorr, although higher or lower reaction pressures can alternatively be used. For example, reaction pressures up to and possibly exceeding 300 torr can be used in some embodiments. The particular reaction pressure chosen affects the deposition rate (i.e., the deposition rate is lower at lower pressures). The limitation on the reaction pressure parameter comes from non-uniformity of deposition at very low pressures, and from gas phase nucleation at very high pressures.

The CVD reaction then proceeds for an amount of time that is related to the desired film thickness, in block 216. By allowing the reaction to proceed, the substrate is thermally oxidized using the gaseous reactants.

The various embodiments can be used to deposit and grow thin or thick films. The deposition/growth rate depends on the reaction parameters (e.g., pressures, temperatures, flow rates). In an embodiment where the reaction temperature is approximately 800 degrees C., the reaction pressure is 350 millitorr, and the ratio of hydrogen chloride to DCS is about 3:1, the deposition rate is approximately 100 Angstroms/hour, in one embodiment. The rate can be higher or lower in other embodiments, depending on how the reaction parameters are varied.

In one embodiment, this completes the reaction. In another embodiment, further deposition processes can be performed while the wafers are still located in the reaction tube. These further deposition processes can use the same reaction gasses, or variations of the reaction gasses, to deposit various dielectric layers. For example, a material used in a conventional dynamic random access memory (DRAM) devices includes a stack of an oxide layer, a nitride layer, and an oxynitride layer. This structure is often referred to as an oxide-nitride-oxynitride or "ONO" structure. Using embodiments of the invention, blocks 212 and 214 can be repeated three times to form an ONO structure. During the first and third iterations, when oxide layers are being formed, no ammonia is present in the reaction gasses.

During the second iteration, while the nitride layer is being formed, ammonia can be introduced to the reaction gasses.

After the reaction is completed, the reaction is turned off, in block 218, and the method ends. In one embodiment, this involves reducing the temperature to a standby temperature (e.g., 600 degrees C.). The reaction gasses are then turned off. In one embodiment, the precursor component is first turned off, and the tube permitted to stabilize. Then, the ammonia component (if any), the chloride component, and the oxidizing component are sequentially turned off, allowing the tube to stabilize between the removal of each component. A cycle purge process is again performed, in one embodiment, to rid the tube of contaminants, and the tube is backfilled with an inert gas (e.g., nitrogen and/or argon). Ultimately, the wafers are withdrawn using a slow pull cycle to avoid exposure of the wafers to share temperature gradients. Desirably, the wafers are withdrawn to an ambient area free of oxygen, in order to prevent contaminants.

The ratios of the reaction gasses within the reaction gas flow can be varied, in different embodiments. The following four tables provide specific reaction gas percentages (based on 100% total) for four embodiments, and percentage ranges for each type of gas.

Table 1 illustrates a specific example of various reaction gas percentages, and a range of gas percentages, for a silicon dioxide layer deposited using hydrogen chloride.

TABLE 1

$SiO_2$ Deposited Using HCl

| Reaction gas | Embodiment A | Percentage ranges |
|---|---|---|
| DCS | 5 | 2–10 |
| HCl | 15 | 5–50 |
| $N_2O$ | 80 | 40–93 |

Table 2 illustrates a specific example of various reaction gas percentages, and a range of gas percentages, for a silicon dioxide layer deposited using chlorine. Notice that, since each $Cl_2$ molecule includes two chloride atoms (as opposed to one chloride atom for each HCl molecule), about half as much $Cl_2$ can be used to provide approximately the same amount of free chloride atoms as is used with HCl as the chloride source.

TABLE 2

$SiO_2$ Deposited Using $Cl_2$

| Reaction gas | Embodiment B | Percentage ranges |
|---|---|---|
| DCS | 5 | 2–10 |
| $Cl_2$ | 7.5 | 2–25 |
| $N_2O$ | 87.5 | 65–96 |

Table 3 illustrates a specific example of various reaction gas percentages, and a range of gas percentages, for a silicon oxynitride layer deposited using hydrogen chloride.

TABLE 3

SiON Deposited Using HCl

| Reaction gas | Embodiment C | Percentage ranges |
|---|---|---|
| DCS | 5 | 2–10 |
| HCl | 15 | 5–50 |
| $NH_3$ | 5 | 2–10 |
| $N_2O$ | 75 | 30–91 |

Finally, Table 4 illustrates a specific example of various reaction gas percentages, and a range of gas percentages, for a silicon oxynitride layer deposited using chlorine.

TABLE 4

SiON Deposited Using $Cl_2$

| Reaction gas | Embodiment D | Percentage ranges |
|---|---|---|
| DCS | 5 | 2–10 |
| $Cl_2$ | 7.5 | 2–25 |
| $NH_3$ | 5 | 2–10 |
| $N_2O$ | 82.5 | 55–94 |

Although specific percentages and percentage ranges are given in the four tables, above, percentages higher or lower than the listed ranges can be used in alternate embodiments. Further, DCS is shown as the precursor source in the above examples. In other embodiments, various halated silanes (e.g., silane, disilane, monochlorosilane, dichlorosilane, trichlorosilane, tetrachlorosilane, and mixtures thereof) can be used. In still other embodiments, the precursor source can be a tantalum precursor, an aluminum precursor, or some other type of precursor.

The embodiments described herein can be used to form dielectric films for a variety of applications. Generally, embodiments of the invention can be used in conjunction with nearly any electronic structure that includes a substrate over which at least one dielectric layer is formed using a CVD process. The substrate can be a semiconductor, such as silicon, germanium, gallium arsenide, or indium phosphide. Alternatively, the substrate can be an insulator, such as glass or aluminum, or a metal, such as stainless steel or iron. The dielectric layer or layers can be, for example, silicon dioxide, silicon oxynitride, tantalum oxynitride, aluminum oxynitride, other oxides, nitrides or oxynitrides, or any combination thereof. Besides the substrate and at least one dielectric layer, the electronic structure also can include one or more conductive layers, semiconductor structures (e.g., gates, capacitors, etc.), and/or other insulating layers, which can be situated above or below the dielectric layer.

Various examples of electronic structures are illustrated in FIGS. 3–8. These examples are not to be construed as limiting the scope of the application only to these specific structures. Instead, these examples are provided for the purpose of further illustrating various types of applications in which embodiments of the invention can be used. Those of skill in the art would understand that embodiments of the invention can be used in a wide variety of other applications, as well. Further, the specific materials and structure described below are for the purposes of illustration, and not of limitation. Those of skill in the art can imagine the use of different materials and/or structures, while still taking advantage of the embodiments of the present invention.

Figure 6:
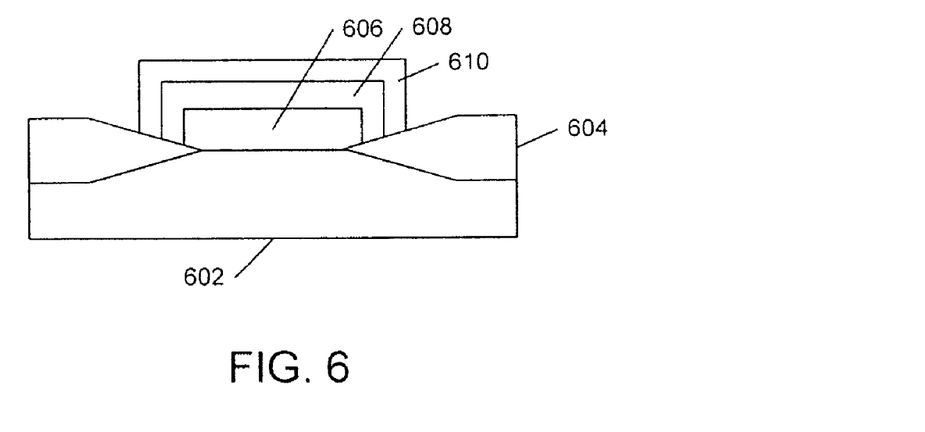
FIG. 6 illustrates a fragmentary, cross-sectional view of a stacked capacitor, partially formed in accordance with an embodiment of the invention.
Figure 7:
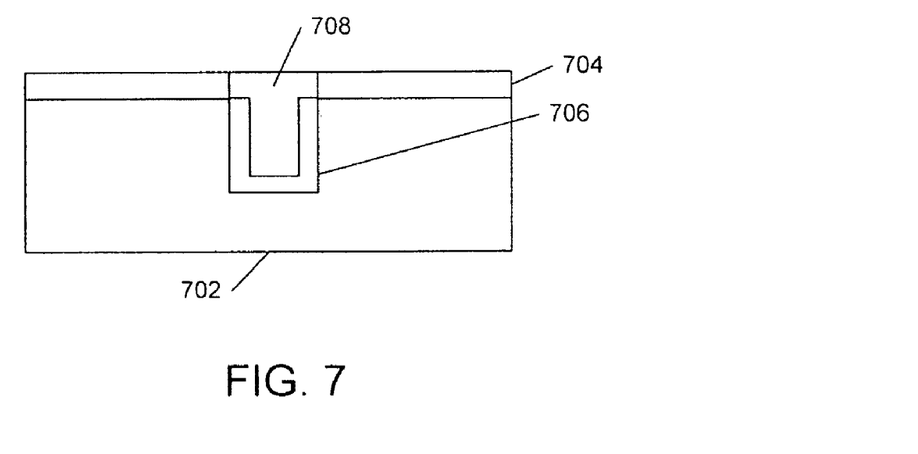
FIG. 7 illustrates a fragmentary, cross-sectional view of a semiconductor device having a trench with an isolation liner, formed in accordance with an embodiment of the invention.
Figure 8:
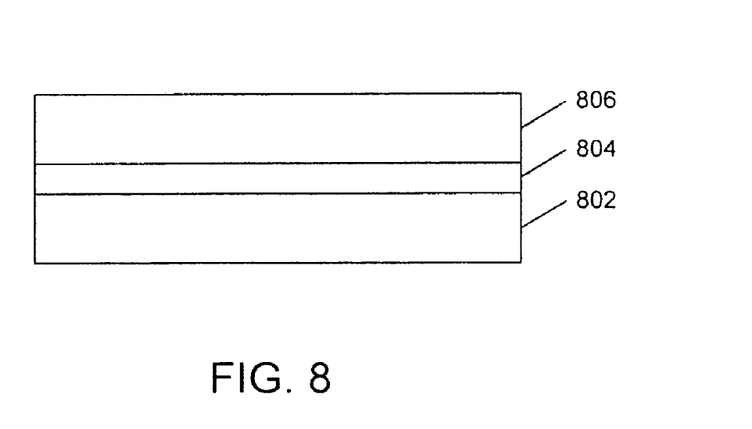
FIG. 8 illustrates a fragmentary, cross-sectional view of a portion of an optical waveguide, partially formed in accordance with an embodiment of the invention.

Specifically, FIGS. 3–7 illustrate various capacitive components, and FIG. 8 illustrates a portion of an optical waveguide. In addition to the illustrated components, embodiments of the invention can also be used in the formation of semiconductor devices that include one or more gates, such as floating gate transistors and insulated gate transistors, for example. In those embodiments, a dielectric layer deposited in accordance with an embodiment of the invention can form one or more spacers for isolating the gates from contacts. Alternatively, a dielectric layer deposited in conjunction with an embodiment of the invention can form a cap over the gates and/or one or more metal layers.

Embodiments of the invention can be used to form numerous structures that include dielectric elements formed from all or portions of a CVD deposited dielectric layer. These structures include both semiconductor and non-semiconductor structures and devices. In one embodiment, a semiconductor die is formed, which includes an integrated circuit supported by a substrate. The integrated circuit can include a plurality of integrated circuit devices with dielectric elements formed in accordance with embodiments of the invention. In one embodiment, the dielectric element has a residual chlorine, meaning that chlorine is a by-product of the formation process of the dielectric element.

Components manufactured using embodiments of the invention can be used in a wide variety of devices and systems. For example, such components can form various types of capacitive devices, memory cells, memory arrays, memory devices, optical waveguides, processors, analog and digital circuits, and other types of devices. A memory array can include a plurality of memory cells. A memory device can include a memory array, row and column access circuitry coupled to the memory array, and an address decoder coupled to the row and column access circuitry.

Figure 3:
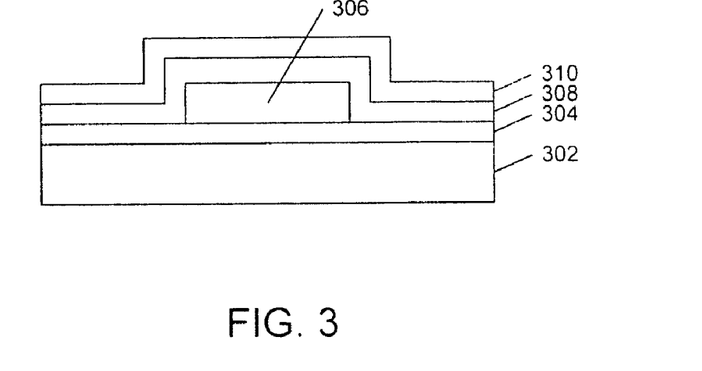
FIG. 3 illustrates a fragmentary, cross-sectional view of a generic semiconductor device, partially formed in accordance with an embodiment of the invention.

Referring now to specific examples, FIG. 3 illustrates a fragmentary, cross-sectional view of a first capacitive component, partially formed in accordance with an embodiment of the invention. The component includes a substrate 302, upon which a first dielectric layer 304 is formed. Layer 304 can be formed, for example, using a CVD process in accordance with an embodiment of the invention.

A first wiring pattern 306 and/or electrode structure is then formed over the dielectric layer 304. The first wiring pattern 306 can be formed, for example, from a group of materials that includes polycide, polycrystalline silicon, silicide, various metals (e.g., molybdenum, tungsten, platinum, titanium, tantalum, zirconium, and palladium), other suitable materials, or any combination thereof.

A second dielectric layer 308 is formed over the wiring pattern 306 and the first dielectric layer 304. Layer 308 can be formed, for example, using a CVD process in accordance with an embodiment of the invention. Further, a second wiring pattern 310 and/or electrode structure is formed over the second dielectric layer 308. The capacitive component is constituted by the first wiring pattern 306, the dielectric layer 308, and the electrode and wiring pattern 310.

Figure 4:
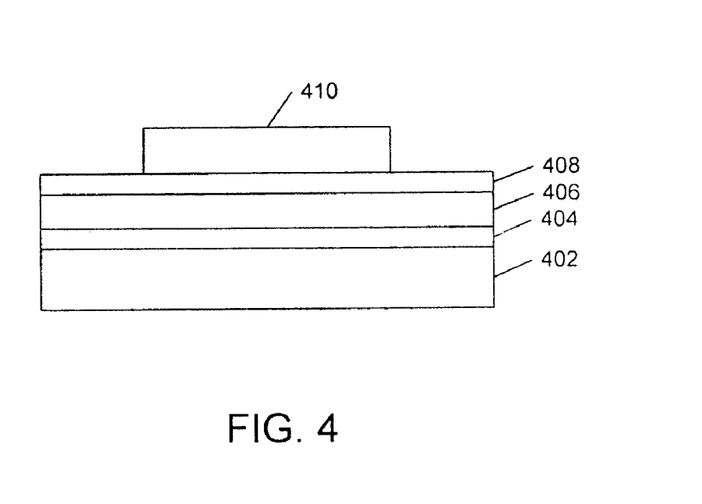
FIG. 4 illustrates a fragmentary, cross-sectional view of a capacitive component, partially formed in accordance with an embodiment of the invention.

FIG. 4 illustrates a fragmentary, cross-sectional view of a second capacitive component, partially formed in accordance with an embodiment of the invention. The capacitive component includes a substrate 402, upon which a first dielectric layer 404 is formed. Layer 404 can be formed, for example, using a CVD process in accordance with an embodiment of the invention.

An electrode layer 406 is then formed over the dielectric layer 404. The first electrode layer 406 can be formed, for example, from a group of materials that includes polycide, polycrystalline silicon, silicide, various metals, other suitable materials, or any combination thereof.

A second dielectric layer 408 is formed over the electrode layer 406. Layer 408 can be formed, for example, using a CVD process in accordance with an embodiment of the invention. Then, a wiring pattern 410 and/or electrode structure is formed over the second dielectric layer 408. The capacitive component is constituted by the electrode layer 406, the dielectric layer 408, and the electrode and wiring pattern 410.

Figure 5:
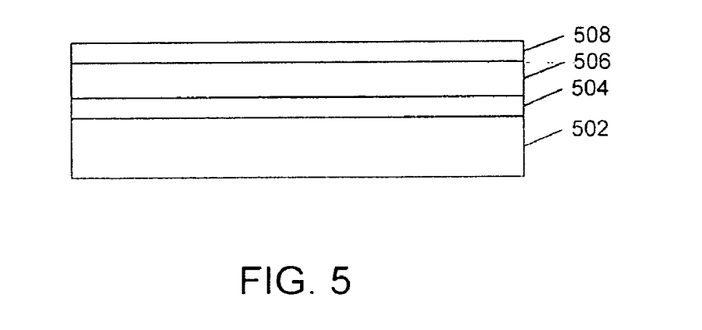
FIG. 5 illustrates a fragmentary, cross-sectional view of a semiconductor device having an oxide-nitride-oxynitride (ONO) stack, partially formed in accordance with an embodiment of the invention.

FIG. 5 illustrates a fragmentary, cross-sectional view of a semiconductor device having an ONO stack, partially formed in accordance with an embodiment of the invention. The ONO stack includes a substrate 502, which can have semiconductor devices formed thereon. For example, but not by way of limitation, metal oxide semiconductor (MOS) devices (not shown) can be formed on the substrate 502. In other embodiments, the substrate can have other types of semiconducting upper portions.

A bottom electrode 504 is then formed on the substrate 502. The bottom electrode 504 can be formed, for example, from a group of materials that includes polycide, polycrystalline silicon, silicide, various metals, other suitable materials, or any combination thereof In one embodiment, the bottom electrode 504 is disposed using a CVD process in an oxygen contained environment, so that a thin, native oxide layer (not shown) is allowed to form on the bottom electrode 504.

A nitride layer 506 is formed over the native oxide layer. Then, an oxynitride layer 508 is formed over the nitride layer 506. In one embodiment, the oxynitride layer 508 is formed using a CVD process in accordance with an embodiment of the invention.

The ONO structure is constituted by the native oxide layer, the nitride layer 506, and the oxynitride layer 508. By repeating portions of the process described above, structures including additional O and N layers can be formed to achieve different capacitor properties. For example, portions of the process can be repeated to form an ONONO structure, an ONONONO structure, and so on.

FIG. 6 illustrates a fragmentary, cross-sectional view of a stacked capacitor, partially formed in accordance with an embodiment of the invention. The stacked capacitor includes a substrate 602, upon which a field oxide film 604 is formed. For example, when the substrate 602 is silicon, the field oxide film 604 can be formed by the local oxidation of silicon so as to provide electrical separation of the capacitor from another element.

A bottom electrode 606 is then formed. In one embodiment, the bottom electrode 606 is deposited on the silicon region of the substrate 602 opposite to the field oxide film region 604, by the selective growth of polycrystalline silicon so as to form the bottom electrode 606 of the capacitor. In other embodiments, the bottom electrode 606 can be formed, for example, from a group of materials that includes polycide, silicide, various metals, other suitable materials, or any combination thereof.

A dielectric film 608 is deposited on the bottom electrode 606. Film 608 can be formed, for example, using a CVD process in accordance with an embodiment of the invention.

A top electrode 610 is then formed. In one embodiment, the top electrode 610 is deposited by the selective growth of polycrystalline silicon so as to form the top electrode 610 of the capacitor. In other embodiments, the top electrode 610 can be formed, for example, from a group of materials that includes polycide, silicide, various metals, other suitable materials, or any combination thereof.

FIG. 7 illustrates a fragmentary, cross-sectional view of a semiconductor device having a trench with an isolation liner (e.g., a trench capacitor), partially formed in accordance with an embodiment of the invention. The trench capacitor includes a substrate 702, upon which an oxide film 704 is formed to electrically separate the capacitor from other elements. For example, when the substrate 702 is silicon, and the oxide film 704 can be formed by thermal oxidation to form a silicon oxide film.

The oxide film 704 is then subjected to patterning, and the substrate 702 is subjected to etching, so as to form a trench. A dielectric film 706 is then deposited on an inner surface of the trench. Film 706 can be deposited, for example, using a CVD process in accordance with an embodiment of the invention.

An electrode film 708 is then deposited and etched back, so that portions of the electrode film 708 remain only within the trench. In one embodiment, the electrode film 708 is formed from polycrystalline silicon. In other embodiments, the electrode film 708 can be formed, for example, from a group of materials that includes polycide, silicide, various metals, other suitable materials, or any combination thereof.

Embodiments of the invention also can be used to form portions of an optical waveguide. An optical waveguide is a structure that guides a light wave by constraining it to travel along a certain desired path. A waveguide traps light by surrounding a guiding region, referred to as a "core," by a material having an index of refraction that is less than the core. This material is referred to as a "cladding." Light can be guided by planar or rectangular waveguides, or by optical fibers, in various embodiments.

FIG. 8 illustrates a fragmentary, cross-sectional view of a portion of an optical waveguide, partially formed in accordance with an embodiment of the invention. The optical waveguide includes a first cladding layer 802, which is formed from any of a number of cladding materials known to those of skill in the art. For example, but not by way of limitation, cladding layer 802 can include silicon dioxide, and/or any of a number of other suitable cladding layer materials.

A core layer 804 is formed over first cladding layer 802. In one embodiment, core layer 804 includes one or more oxide and nitride layers (e.g., an ONO structure), which form at least a portion of a planar waveguide core. All or portions of core layer 804 can be deposited, for example, using a CVD process in accordance with an embodiment of the invention. Core layer 804 may or may not be patterned during or subsequent to its deposition.

A second cladding layer 806 is formed overlying film 804. For example, but not by way of limitation, second cladding layer 806 can include silicon dioxide, and/or any of a number of other suitable cladding layer materials.

Figure 9:
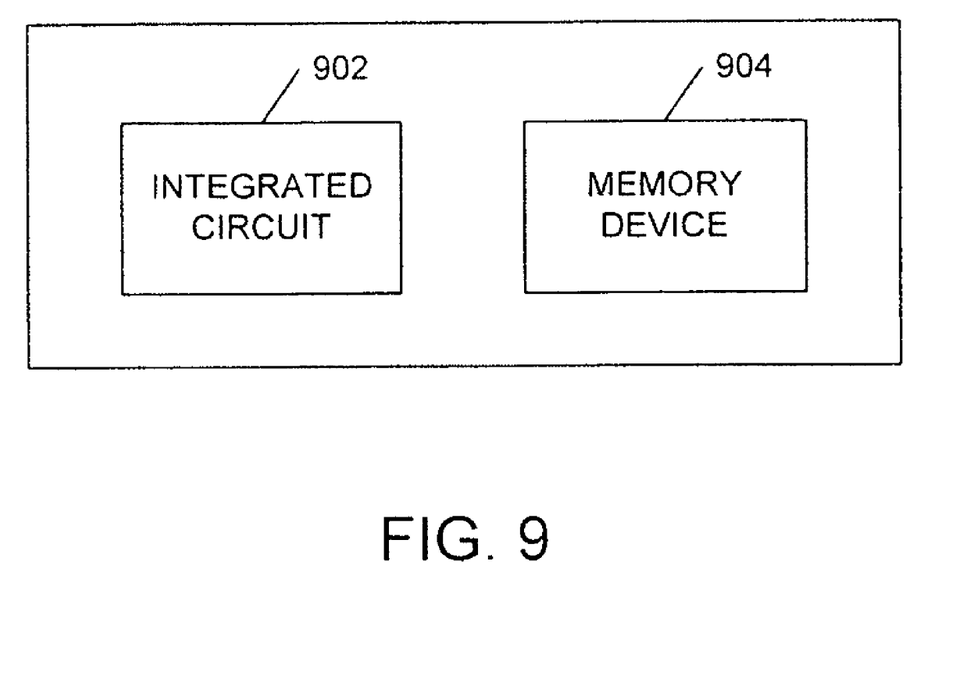
FIG. 9 illustrates an electronic system, which includes at least one semiconductor device, partially formed in accordance with an embodiment of the invention.

Devices formed using various embodiments of the invention can form part of an electronic system. FIG. 9 illustrates an electronic system, in accordance with an embodiment of the present invention. The system shown in FIG. 9 can be, for example, a computer, a wireless or wired communication device (e.g., telephone, modem, cell phone, pager, radio, etc.), a television, a monitor or virtually any other type of electronic system that can benefit from the use of back side, cavity mounted capacitors.

The electronic system includes one or more integrated circuits 902 and one or more memory devices 904. Integrated circuit 902 can be, for example but not by way of limitation, a processor, application specific integrated circuit (ASIC), or virtually any other type of integrated circuit. Memory device 904 can be, for example but not by way of limitation, a random access memory (RAM), dynamic RAM (DRAM), read only memory (ROM), any of a variety of derivations of RAMs and ROMs, or any of a number of other types of memory devices. In various embodiments, the system can include numerous other types of electrical components, interconnects, power supplies, busses, ports, interfaces, printed circuit boards, sockets, interposers, and other portions of an electronic system. Integrated circuit 902 and/or memory device 908 include electrical components, which include one or more dielectric layers formed in accordance with various embodiments of the present invention.

Various embodiments of methods and apparatus for depositing dielectric layers have been described, along with a description of the incorporation of the embodiments within an electronic system. The various embodiments provide more stable deposition of dielectric layers. Further, the various embodiments provide improved stabilization of the reaction stoichiometry and the reaction rate in various CVD systems.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for depositing a dielectric film, the method comprising:
   heating a chamber, within which a substrate is located, to a temperature sufficient to thermally decompose an oxidizing component; and
   passing reaction gasses over the substrate to deposit the dielectric film forming a blanket dielectric deposition over substantially the entirety of at least one surface of the substrate, wherein the reaction gasses include a silicon bearing component, the oxidizing component, and a chloride component, and wherein the silicon bearing component and the chloride component are included within distinct ones of the reaction gasses introduced into the chamber.

2. The method of claim 1, wherein the dielectric film is an oxide film.

3. The method of claim 1, wherein the reaction gasses further includes ammonia, and the dielectric film is an oxynitride film.

4. The method of claim 1, wherein the silicon bearing component consists essentially of one or more halated silanes.

5. The method of claim 1, wherein the silicon bearing component includes at least one component selected from the group consisting of silane, disilane, monochlorosilane, dichlorosilane, trichlorosilane, and tetrachlorosilane, in any combination.

6. The method of claim 1, wherein the chloride component includes at least one component selected from the group consisting of hydrogen chloride and chlorine, in any combination.

7. The method of claim 1, wherein the substrate is heated to a temperature in a range between 700 degrees C. and 950 degrees C., inclusive.

8. The method of claim 1, wherein the reaction gasses have a total pressure in a range between 50 milliTorr and 4000 milliTorr inclusive.

9. A method for depositing a dielectric film, the method comprising:
   heating a substrate, within a chamber, to a temperature sufficient to thermally decompose an oxidizing component; and
   passing reaction gasses over the substrate forming a blanket dielectric deposition over substantially the entirety of at least one surface of the substrate, wherein the reaction gasses include a silicon bearing component, the oxidizing component, and chlorine, and wherein the silicon bearing component and the chlorine are included within distinct ones of the reaction gasses introduced into the chamber.

10. The method of claim 9, wherein the silicon bearing component consists essentially of dichlorosilane.

11. The method of claim 9, wherein the oxidizing component consists essentially of nitrous oxide.

12. The method of claim 9, wherein the reaction gasses further includes ammonia, and the dielectric film is an oxynitride film.

13. A method for depositing a dielectric film, the method comprising:
heating a substrate, within a chamber, to a temperature sufficient to thermally decompose an oxidizing component; and
passing reaction gasses over the substrate forming a blanket dielectric deposition over substantially the entirety of at least one surface of the substrate, wherein the reaction gasses include a silicon bearing component, the oxidizing component, and hydrogen chloride, and wherein the silicon bearing component and the hydrogen chloride are included within distinct ones of the reaction gasses introduced into the chamber.

14. The method of claim 13, wherein the silicon bearing component consists essentially of dichlorosilane.

15. The method of claim 13, wherein the oxidizing component consists essentially of nitrous oxide.

16. The method of claim 13, wherein the reaction gasses further includes ammonia, and the dielectric film is an oxynitride film.

17. A method for depositing a dielectric film, the method comprising:
heating a substrate, within a chamber, to a temperature sufficient to thermally decompose an oxidizing component; and
passing reaction gasses over the substrate forming a blanket dielectric deposition over substantially the entirety of at least one surface of the substrate, wherein the reaction gasses include a silicon bearing component, the oxidizing component, an ammonia component, and a chloride component, and wherein the silicon bearing component and the chloride component are included within distinct ones of the reaction gasses introduced into the chamber.

18. The method of claim 17, wherein the silicon bearing component consists essentially of dichlorosilane.

19. The method of claim 17, wherein the oxidizing component consists essentially of nitrous oxide.

20. The method of claim 17, wherein the chloride component consists essentially of hydrogen chloride.

21. The method of claim 17, wherein the chloride component consists essentially of chlorine.

22. A method for depositing an oxynitride film, the method comprising:
heating a substrate, within a chamber, to a temperature sufficient to thermally decompose an oxidizing component; and
passing reaction gasses over the substrate forming a blanket dielectric deposition over substantially the entirety of at least one surface of the substrate, wherein the reaction gasses include a precursor component, the oxidizing component, an ammonia component, and a chloride component, and wherein the precursor component and the chloride component are included within distinct ones of the reaction gasses introduced into the chamber.

23. The method of claim 22, wherein the precursor component includes at least one component selected from the group consisting of a silicon bearing component, a tantalum bearing component, and an aluminum bearing component, in any combination.

24. The method of claim 22, wherein the precursor component includes at least one component selected from the group consisting of silane, disilane, monochlorosilane, dichlorosilane, trichlorosilane, and tetrachlorosilane, in any combination.

25. The method of claim 22, wherein the precursor component consists essentially of a tantalum bearing component.

26. The method of claim 22, wherein the precursor component consists essentially of an aluminum bearing component.

27. The method of claim 22, wherein the oxidizing component consists essentially of nitrous oxide.

28. The method of claim 22, wherein the chloride component consists essentially of hydrogen chloride.

29. The method of claim 22, wherein the chloride component consists essentially of chlorine.

30. A method for fabricating a semiconductor device, comprising:
heating a substrate, within a chamber; and
depositing a blanket dielectric layer over substantially the entirety of the substrate by passing reaction gasses over the substrate, wherein the reaction gasses include a silicon bearing component, an oxidizing component, and a chloride component, and wherein the silicon bearing component and the chloride component are included within distinct ones of the reaction gasses introduced into the chamber.

31. The method of claim 30, wherein the reaction gasses further includes an ammonia component, and the dielectric layer is an oxynitride layer having thermal properties that make the semiconductor device suitable for use as an optical waveguide.

32. The method of claim 30, further comprising:
etching a trench into the substrate, wherein the dielectric layer is an oxide deposited on an inner surface of the trench.

33. The method of claim 32, further comprising:
allowing a native oxide layer to form prior to depositing the dielectric layer;
depositing a nitride layer over the native oxide layer prior to depositing the dielectric layer; and
wherein depositing the dielectric layer includes also including an ammonia component in the gas flow, so that the dielectric layer is an oxynitride layer.

34. A method for fabricating a semiconductor device, comprising:
heating a substrate; and
depositing a dielectric layer over the substrate by passing a gas flow over the substrate, wherein the gas flow includes a silicon bearing component, an oxidizing component, and a chloride component, and wherein the silicon bearing component and the chloride component are distinct from each other, wherein the semiconductor device includes one or more gates, and wherein the dielectric layer forms one or more spacers for isolating the one or more gates from one or more contacts.

35. A method for fabricating a semiconductor device, comprising:
heating a substrate; and
depositing a dielectric layer over the substrate by passing a gas flow over the substrate, wherein the gas flow includes a silicon bearing component, an oxidizing component, and a chloride component, and wherein the silicon bearing component and the chloride component are distinct from each other, wherein the semiconductor device includes one or more gates and one or more metal layers, and wherein the dielectric layer forms a cap over the one or more gates and the one or more metal layers.

36. A method for forming a dielectric structure, the method comprising:

heating a silicon substrate, in a furnace deposition tube, to a temperature in a range of 700 degrees C. to 950 degrees C., inclusive; and thermally oxidizing at least all non-insulator portions of the surface of the silicon substrate, in the furnace tube, using gaseous reactants, which include a chloride component, dichlorosilane, and nitrous oxide, wherein the chloride component and the dichlorosilane are included in distinct gasses introduced into the furnace deposition tube.

37. The method of claim 36, wherein the chloride component includes hydrogen chloride.

38. The method of claim 36, wherein the chloride component includes chlorine.

39. The method of claim 38, wherein thermally oxidizing the silicon substrate further includes using ammonia as one of the gaseous reactants.

* * * * *

UNITED STATES PATENT AND TRADEMARK OFFICE
CERTIFICATE OF CORRECTION

PATENT NO. : 7,071,117 B2
APPLICATION NO. : 10/788892
DATED : July 4, 2006
INVENTOR(S) : Powell It is certified that error appears in the above-identified patent and that said Letters Patent is hereby corrected as shown below:

On Title Page
On page 2, in item (56), under "Other Publications", in column 2, line 1, delete ""Charaterization" and insert -- "Characterization --, therefor.

In column 5, line 65, delete "source 136" and insert -- source 130 --, therefor.

In column 10, line 11, delete "thereof" and insert -- thereof. --, therefor.

In column 14, line 6, in Claim 24, delete "monochiorosilane," and insert -- monochlorosilane, --, therefor.

In column 14, line 7, in Claim 24, delete "tetrachiorosilane," and insert -- tetrachlorosilane, --, therefor.

Signed and Sealed this

Twentieth Day of February, 2007

JON W. DUDAS
*Director of the United States Patent and Trademark Office*